US006396748B1

United States Patent
Fujita (10) Patent No.: US 6,396,748 B1
(45) Date of Patent: May 28, 2002

(54) METHOD AND APPARATUS FOR SETTING REDUNDANCY DATA FOR SEMICONDUCTOR MEMORY DEVICE

(75) Inventor: Mamoru Fujita, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/546,687

(22) Filed: Apr. 11, 2000

(30) Foreign Application Priority Data

Apr. 15, 1999 (JP) .......................................... 11-108069

(51) Int. Cl.$^7$ .............................................. G11C 29/00
(52) U.S. Cl. .................. 365/200; 365/201; 365/230.03; 365/230.06; 365/225.7
(58) Field of Search ........................... 365/200, 230.03, 365/225.7, 230.06, 201, 189.07

(56) References Cited

U.S. PATENT DOCUMENTS

| | | | | |
|---|---|---|---|---|
| 5,022,006 A | * | 6/1991 | Fifield et al. | ................ 365/200 |
| 5,031,151 A | * | 7/1991 | Fifield et al. | ................ 365/195 |
| 5,986,952 A | * | 11/1999 | McConnell et al. | ........ 365/200 |

FOREIGN PATENT DOCUMENTS

| | | | | |
|---|---|---|---|---|
| JP | 2-192100 | 7/1990 | ........... | G11C/29/00 |
| JP | 5-198199 | 8/1993 | ........... | G11C/29/00 |
| JP | 6-68693 | 3/1994 | ........... | G11C/29/00 |
| JP | 6-203594 | 7/1994 | ........... | G11C/29/00 |

OTHER PUBLICATIONS

Japanese Office Action dated Jan. 30, 2002, with partial translation.

* cited by examiner

Primary Examiner—Andrew Q. Tran
(74) Attorney, Agent, or Firm—McGinn & Gibb, PLLC (57) ABSTRACT

A semiconductor memory device in which a memory cell array is divided into a plurality of operation blocks and one regular word line is activated simultaneously in each of two or more operation block. In the semiconductor memory device, when a defective regular word line is set for replacement with a spare word line, data is recorded in fuse ROM (read only memory) in the semiconductor memory device such that a regular word line to be replaced and a replacing spare word line are located in the same operation block or not located each in combined operation blocks which are activated simultaneously. This can prevent the simultaneous activation of a regular word line and a spare word line in the same operation block and malfunction of the semiconductor memory device.

8 Claims, 7 Drawing Sheets

METHOD AND APPARATUS FOR SETTING REDUNDANCY DATA FOR SEMICONDUCTOR MEMORY DEVICE

BACKGROUND OF THE INVENTION

1. Field of the Invention

The present invention relates to a semiconductor memory device having regular word lines, spare words lines, and an address storage unit for storing replacement information of the regular word lines and spare word lines, and more particularly to a method and apparatus for setting word addresses as redundancy data in the address storage unit.

2. Description of the Prior Art

Currently, semiconductor memory devices such as RAMs (Random Access Memories) are utilized in various types of electronic equipment, and such a semiconductor memory device has an increasingly larger capacity and higher integration. However, several problems exist in manufacturing semiconductor memory devices of a large capacity and high integration with high yields. For this reason, currently, a redundant configuration is generally employed in which spare memory cells are provided in a semiconductor memory device at the manufacturing, and such a spare memory cell replaces a memory cell having a defect found in an inspection. Various approaches exist for arranging spare memory cells, and for example, spare memory cells are provided based on word lines.

A typical semiconductor memory device includes a number of memory cells arranged in two-dimensional array, each memory cell connecting to one of a plurality of bit lines and one of a plurality of word lines. Some semiconductor memory devices divide such a number of memory cells into a plurality of operation blocks in the arranging direction of the word lines such that one of word lines is activated in the respective operation blocks simultaneously. In such a semiconductor memory device, the number of actually arranged word lines may be reduced to a fraction of the data length of a bit address, and stored data of a plurality of bits may be read in parallel at a time. When spare word lines are provided as described above in such a semiconductor memory device which simultaneously activates word lines in a plurality of operation blocks, a number of regular word lines and a few spare word lines are generally arranged in each operation block. A regular word line refer to a word line to be used in normal times, i.e. when no defect is present.

The internal configuration of a conventional semiconductor memory device of such a structure will be now described with reference to FIG. 1. Description is made for a DRAM (Dynamic RAM) used as a semiconductor memory device.

DRAM 1000 comprises a number of memory cells 1001 which are two-dimensionally arranged in a row direction and a column direction to constitute a memory cell array. In DRAM 1000, the memory cell array is divided into a plurality of operation blocks "a", "b", . . . in the column direction. A number of regular word lines 1002 and a few spare word lines 1003 in parallel with the row direction are arranged along the column direction. Similarly, a plurality of bit lines 1004 in parallel with the column direction are arranged in the row direction. A plurality of memory cells 1001 belonging to the same row share one word line and are connected thereto. A plurality of memory cells 1001 belonging to the same column are connected to one bit line 1004.

Each memory cell 1001 has a unique cell address set therefor, each of word lines 1002, 1003 has a unique word address set therefor, and each bit line 1004 has a unique bit address set therefor.

Memory cells 1001 connected to regular word lines 1002 are provided for use in normal times, i.e. when no defect is present. On the other hand, memory cells 1001 connected to spare word lines 1003 are provided as an alternative when a defect is present. Since the memory cell array comprising a number of memory cells 1001 is divided into a plurality of operation blocks "a", "b", along the column direction as described above, each of the plurality of operation blocks "a", "b", . . . is provided with a plurality of regular word lines 1002 and one spare word line 1003 in DRAM 1000. Respective word lines 1002, 1003 are individually connected to word drivers 1005 for driving word lines. Similarly, respective bit lines 1004 are individually connected to sense amplifiers 1006 for driving bit lines. Sense amplifiers 1006 are integrated for each operation block to constitute sense amplifier array SA.

Sense amplifiers 1006 and word drives 1005 are connected to one address decoder 1007 which converts a cell address into word addresses and a bit address. However, word control circuit 1008 for controlling the replacement of a regular word line with a spare word line is interposed in the connection between address decoder 1007 and word drivers 1005.

Address decoder 1007 receives a cell address as an external input and generates a plurality of word addresses and one bit address from the provided cell address. The word addresses generated cause corresponding word drives 1005 to be simultaneously activated, resulting in a plurality of regular word lines 1002 being activated simultaneously. Sense amplifier 1006 activates one bit line 1004 corresponding to the generated bit address. Specifically, sense amplifier array SA decodes the bit address to activate a bit line corresponding to the bit address.

It should be noted that DRAM 1000 herein illustrated is previously set such that a plurality of word addresses generated from a cell address activate one regular word line 1002 in respective operation blocks of a predetermined combination of ("a" and "c") and ("b" and "d").

Word control circuit 1008 includes fuse ROM 1009 for storing addresses. Fuse ROM 1009 has previously set data which indicates regular word lines 1002 to be replaced and replacing spare word lines 1003. Word control circuit 1008 compares a word address generated by address decoder 1007 with word addresses of regular word lines to be replaced set in fuse ROM 1009, and if a match occurs, causes word driver 1005 to activate spare word line 1003 at a replacing word address. If the word address generated by address decoder 1007 does not match any of word addresses of regular word lines to be replaced, the replacement of the word line is not performed, and a regular word line at the word address generated by address decoder 1007 is activated.

A case where a regular word line is not replaced with a spare word line is now considered.

When DRAM 1000 is provided with a cell address from the outside, address decoder 1007 generates a plurality of word addresses and a bit address, and a plurality of regular word lines 1002 and bit line 1004 are activated corresponding to the address data. This causes a memory access such as data writing and data reading to be performed to a memory cell located at an intersection point of activated regular word lines 1002 and activated bit line 1004 corresponding to the cell address. At this point, one word line 1002 is activated in each of two operation blocks of a predetermined combination as described above, which is substantially equivalent to a structure with two operation blocks connected in a vertical direction, thereby making it possible to access to one memory cell 1001 in a double range of the data length of the bit address. In this manner, conventional DRAM 1000 simultaneously activates one bit line 1004 and one regular word line 1002 in respective operation blocks of a predetermined combination to perform a memory access to one memory cell 1001. However, the memory access become invalid when a defect is present in memory cell 1001 or regular word lines 1002 to be activated.

For this reason, in manufacturing DRAM 1000 as described above, memory cells 1001 and regular word lines 1002 are inspected at the final step. If a defect is found, the word address of regular word line 1002 having the found defect is set as a target to be replaced in fuse ROM 1009, and only DRAMs 1000 for which this data setting is completed are shipped as products.

In DRAM 1000 with data setting completed, a word address generated from a cell address is compared with word addresses of targets to be replaced which are set in fuse ROM 1009, and if a match occurs, replacing spare word line 1003 is activated without activating regular word line 1002 to be replaced. Thus, a memory access is not performed to defective regular word line 1002 but instead to spare word line 1003 with no defect. As a result, even when a defect is present in memory cell 1001 or regular word line 1002, a memory access intended therefor is performed to normal memory cell 1001 or spare word line 1003 instead, allowing the normal operation of DRAM 1000. The replacement of defective regular word line 1002 with spare word line 1003 is typically performed in one operation block. Specifically, one defective regular word line 1002 in operation block "a" is replaced with spare word line 1003 in operation block "a". However, when a plurality of defective regular word lines 1002 occur in one operation block, spare word line 1003 suffers the shortage. To prevent this, a plurality of spare word lines 1003 may be provided in each of operation blocks, which means an increased number of spare word lines 1003 left unused when no defect occurs.

Thus, in DRAM 1000 of the aforementioned structure, attempts are made to replace defective regular word line 1002 with spare word line 1003 in an operation block other than that of line 1002. In this case, it is possible to handle even a plurality of defective regular word lines 1002 occurring in one operation block as well as to minimize the number of spare word lines 1003 to be provided.

However, such replacement of defective regular word line 1002 with spare word line 1003 in an operation block other than that of line 1002 may cause a malfunction in DRAM 1000 of the aforementioned scheme. For example, when operation blocks "a" and "c" are simultaneously activated in DRAM 1000 as described above, the replacement of defective regular word line 1002 in operation block "a" with spare word line 1003 in operation block "c" results in the simultaneous activation of a regular word line 1002 and a spare word line 1003 in operation block "c". This means that even one bit line 1004 activated in operation block "c" causes the simultaneous activation of two memory cells 1001 connected to that bit line 1004. Thus, DRAM 1000 can not perform a normal memory access and a malfunction occurs.

SUMMARY OF THE INVENTION

It is an object of the present invention to provide a method of setting data in a semiconductor memory device which has a structure for simultaneously activating a plurality of operation blocks of a predetermined combination and which can replace a regular word line with a spare word line which is in an operation block other than that of the regular word line, such that no malfunction is generated in the semiconductor memory device.

It is another object of the present invention to provide a data setting apparatus for setting data in a semiconductor memory device which has a structure for simultaneously activating a plurality of operation blocks of a predetermined combination and which can replace a regular word line with a spare word line which is in an operation block other than that of the regular word line to allow data setting with no malfunction generated in the semiconductor memory device.

It is a yet further object of the present invention to provide a semiconductor memory device which has a structure for simultaneously activating a plurality of operation blocks in a predetermined combination and which generates no malfunction.

According to a first aspect of the present invention, a data setting method is provided for setting word addresses in address storing means in a semiconductor memory device such that a regular word line to be replaced and a replacing spare word line are located in the same operation block or not located each in combined operation blocks which are activated simultaneously.

According to the data setting method of the present invention, even with the semiconductor memory device having an existing structure which imposes no limitation in terms of hardware upon combinations of operation blocks of a regular word line to be replaced and a replacing spare word line, a plurality of word addresses can be generated from one cell address and one word line can be activated simultaneously in each of a plurality of operation blocks without activating a spare word line and a regular word line simultaneously in the same operation block, thereby allowing malfunction to be prevented.

According to a second aspect of the present invention, a data setting apparatus is provided which comprises block data storing means for previously storing combinations of operation blocks which are simultaneously activated in a semiconductor memory device, word line inspection means for inspecting the semiconductor memory device to find a defective regular word line, data setting means for setting a word address of the found regular word line in the address storing means, and setting control means for referring to stored data in the block data storing means and controlling the data setting operations of the data setting means such that a regular word line to be replaced and a replacing spare word line are located in the same operation block or not located each in combined operation blocks which are activated simultaneously.

In the data setting apparatus, the block data storing means previously stores combinations of operation blocks which are simultaneously activated in the semiconductor memory device, the stored data is referred to by the setting control means which controls the data setting operations of the data setting means such that a regular word line to be replaced and a replacing spare word line are located in the same operation block or not located each in combined operation blocks which are activated simultaneously. Therefore, according to the data setting apparatus, even with the semiconductor memory device having an existing structure which imposes no limitation in terms of hardware upon combinations of operation blocks of a regular word line to be replaced and a replacing spare word line, a spare word line and a regular word line are not activated simultaneously in the same operation block, thereby allowing malfunction to be prevented.

According to a third aspect of the present invention, a data setting apparatus is provided which comprises block data storing means for previously storing combinations of operation blocks which are simultaneously activated in a semiconductor memory device, data input means for receiving identification data of regular word lines to be replaced in the semiconductor memory device, data setting means for setting a word address of a regular word line whose identification data has been inputted to the data input means in the address storing means, and setting control means for referring to stored data in the block data storing means and controlling the data setting operations of the data setting means such that a regular word line to be replaced and a replacing spare word line are located in the same operation block or not located each in combined operation blocks which are activated simultaneously.

In this data setting apparatus, identification data of a defective spare word line is inputted to the data input means as well as identification data of a defective regular word line of the semiconductor memory device, and the inputted identification data of the defective spare word line is also stored in the block data storing means. Since the setting control means controls the data setting operations of the data setting means such that the stored defective spare word line is not a replacement, a defective regular word line is not replaced with a defective spare word line. In the data setting apparatus, the block data storing means may be any which temporarily stores various information, for example, an storage area of an information storage medium such as RAMs (Random Access Memory) is given as an example. The data input means may be any which receives input of various data, including a keyboard for receiving data input through manual operations, a communication I/F (interface) for receiving data input through signal reception, a drive device for reading recorded data from an information storage medium such as FD (Floppy Disc) or CD (Compact Disc)-ROM (Read Only Memory). The identification data of the word line may be any which individually identifies a number of word lines, and for example, a word address is included.

According to a fourth aspect of the present invention, a semiconductor memory device is provided in which a regular word line to be replaced and a replacing spare word line are located in the same operation block or not located each in combined operation blocks which are activated simultaneously. In this semiconductor memory device, a plurality of word addresses can be generated from one cell address and one word line can be activated simultaneously in each of a plurality of operation blocks without activating a spare word line and a regular word line simultaneously in the same operation block, thereby allowing malfunction to be prevented.

The above and other objects, features, and advantages of the present invention will become apparent from the following description based on the accompanying drawings which illustrate examples of preferred embodiments of the present invention.

DESCRIPTION OF THE PREFERRED EMBODIMENT

Next, a preferred embodiment of the present invention will be described with reference to the drawings. FIG. 2 illustrates an internal configuration of a semiconductor memory device of an embodiment of the present invention. Description is herein made for a DRAM used as a semiconductor memory device. In FIG. 2, components identical to those in FIG. 1 are designated the same reference numerals.

Figure 1:
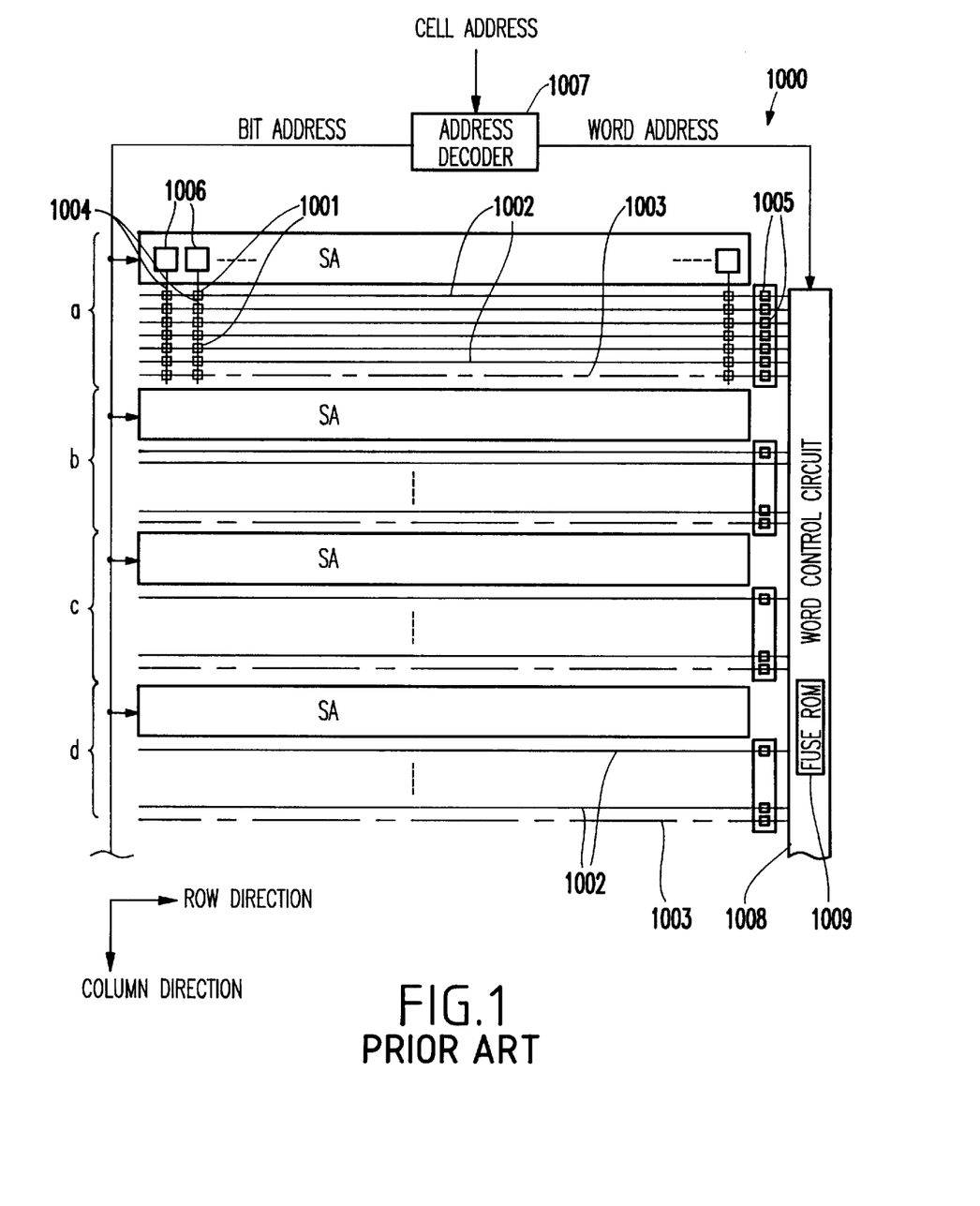
FIG. 1 is a diagram schematically showing an example of an internal configuration of a conventional semiconductor memory device.
Figure 2:
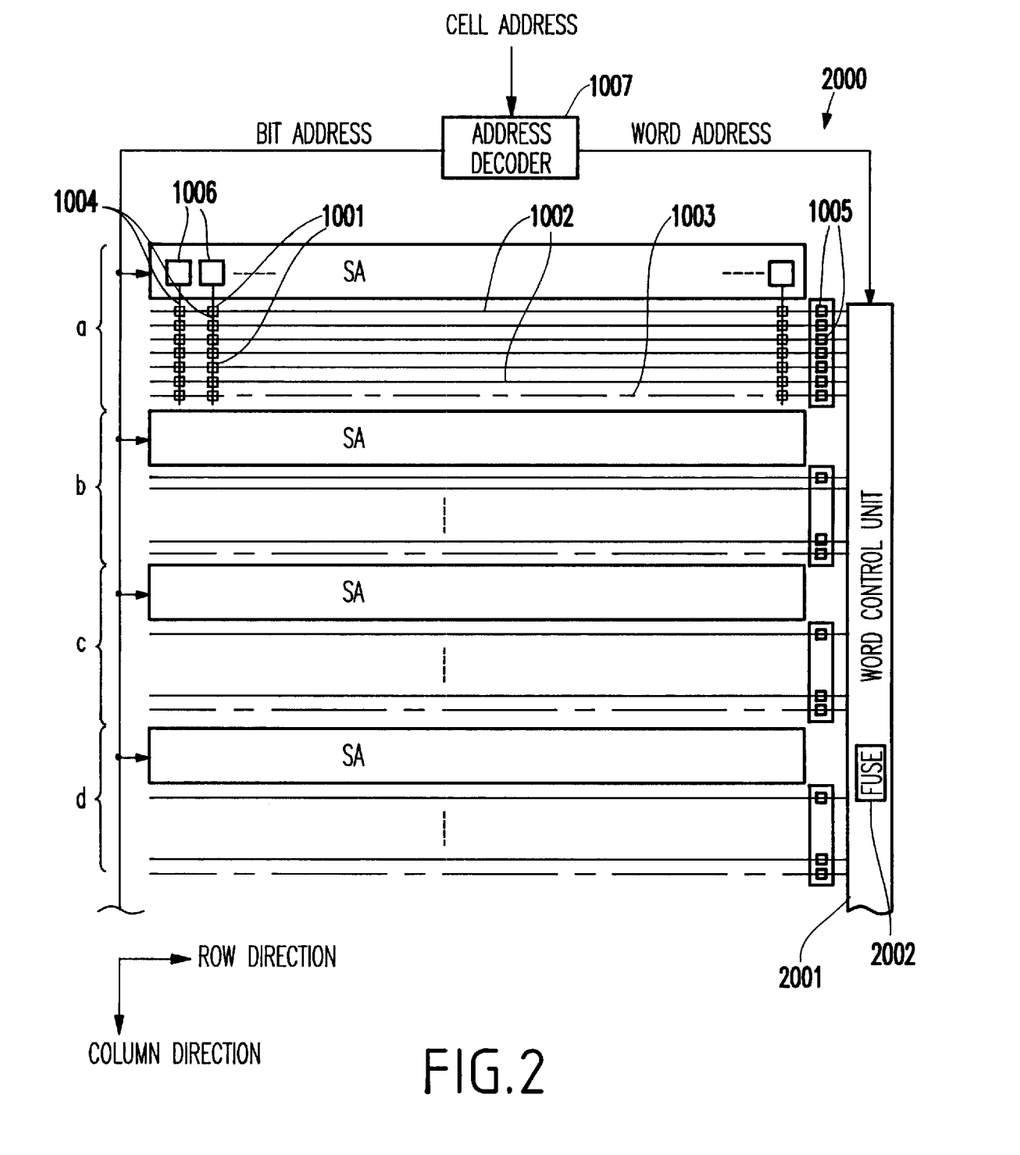
FIG. 2 is a diagram schematically showing an internal configuration of a semiconductor memory device in a preferred embodiment of the present invention.

DRAM 2000 shown in FIG. 2 includes, similarly to DRAM 1000 shown in FIG. 1, a number of memory cells 1001 arranged in two-dimension array, each memory cell connecting one of word lines 1002, 1003 and one of bit lines 1004. Each memory cell 1001 has a unique cell address set therefor. Each of word lines 1002, 1003 has a unique word address set therefor, and each bit line 1004 has a unique bit address set therefor.

A number of memory cells 1001 arranged two-dimensionally are divided into a plurality of operation blocks "a", "b", . . . A number of regular word lines 1002 and one spare word line 1003 are provided in each of operation blocks "a", "b", . . . Word lines 1002, 1003 are respectively connected to word drivers 1005 for driving word lines. Bit lines 1004 are respectively connected to sense amplifiers 1006 for driving bit lines. A plurality of sense amplifiers 1006 are collected for each operation block to constitute sense amplifier array SA.

Address decoder 1007 is also provided for generating a single bit address and a plurality of word addresses from a cell address received from the outside. The bit address is provided from address decoder 1007 directly to each sense amplifier array SA, while the word addresses are provided from the address decoder to word drivers 1005 through word control circuit 2001. Word control circuit 2001 includes fuse ROM 2002 for storing word addresses of word lines to be replaced and word addresses of replacing word lines.

In this manner, DRAM 2000 shown in FIG. 2 has a hardware configuration identical to that of conventional DRAM 1000 shown in FIG. 1 except that the data structure of set data in fuse ROM 2002 in word control circuit 2001 is different from that of DRAM 1000 shown in FIG. 1.

Specifically, a word address of regular word line 1002 to be replaced is also set for each word address of replacing spare word line 1003 in fuse ROM 2002 in DRAM 2000. In this case, the word address data is set such that regular word line 1002 to be replaced and replacing spare word line 1003 corresponding thereto are located in the same operation block or not located in combined operation blocks which are activated simultaneously. Such data setting in the fuse ROM allows the replacement of a defective regular word line with a spare word line. In this case, even when a replacing spare word line is located in an operation block different from that of a regular word line to be replaced, the spare word line and a regular word line in the same operation block are not activated simultaneously, thereby generating no malfunction due to the replacement setting while the replacement setting with spare word lines has a high degree of flexibility.

Next, description is made for a configuration to fabricate DRAM 2000 in which the replacement setting with spare word lines is performed in the aforementioned manner. Memory fabricating system 1 shown in FIG. 3 comprises memory manufacturing apparatus 2, memory test apparatus 3 for inspecting a memory to detect a defective regular word line, data setting apparatus 4 for setting data for fuse ROM 2002 in DRAM 2000, and memory carrying mechanism (not shown) and the like. Data setting apparatus 4 comprises computer unit 100 and address setting unit 200. Memory manufacturing apparatus 2 manufactures DRAM 2000 through ordinary thin film processes. Memory test apparatus 3 inspects manufactured DRAM 2000 in a conventional manner and finds any defective regular word line 1002. Memory test apparatus 3 transfers a word address of the found defective regular word line 1002, which serves as identification data, to data setting apparatus 4 as a data file together with identification data of DRAM 2000. Data setting apparatus 4 receives the data file from memory test apparatus 3 at computer unit 100, and sets the word address of defective regular word line 1002 in fuse ROM 2002 in DRAM 2000 with address setting unit 200 controlled by computer unit 100.

Figure 4:
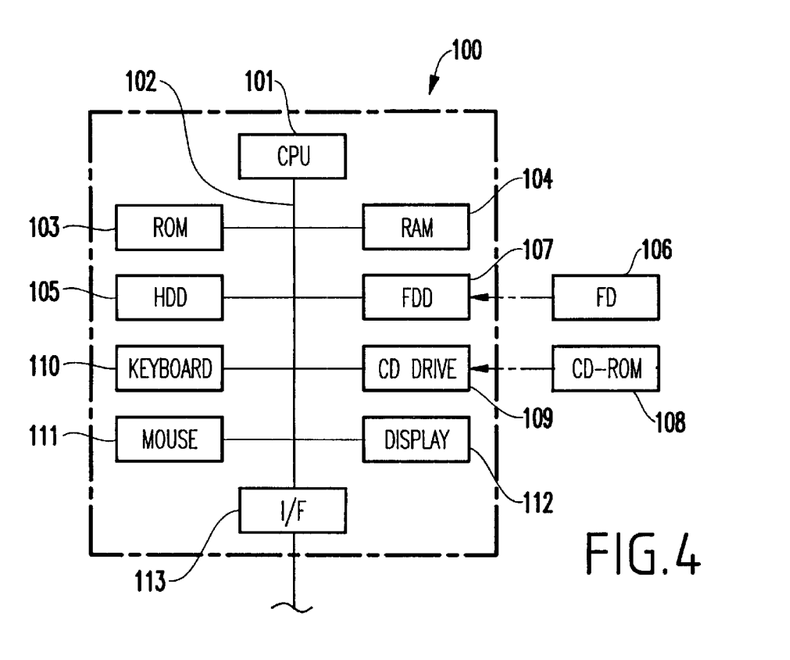
FIG. 4 is a block diagram showing a physical configuration of a computer unit included in a data setting apparatus.

More specifically, in memory fabricating system 1, computer unit 100 in data setting apparatus 4 is comprised of, for example, a personal computer, and as shown in FIG. 4, includes CPU (Central Processing Unit) 101 as hardware which serves as a main portion of the computer.

CPU 101 is connected through bus line 102 to hardware such as ROM 103, RAM 104, HDD (Hard Disk Drive) 105, FDD (Floppy Disk Drive) 107 mounted with FD 106, CD (Compact Disk-ROM) drive 109 loaded with CD-ROM 108, key board 110, mouse 111, display 112, and communication interface (I/F) 113. Communication interface 113 is connected to memory test apparatus 3 or address setting apparatus 200.

In computer unit 100, information storage media such as ROM 103, RAM 104, HDD 105, FD 106, and CD-ROM 108 store programs or data required for various operations of the computer unit 100. For example, control programs for causing CPU 101 to execute various processing operations are previously stored in FD 106 or CD-ROM 108. Such software is previously stored from FD 106 or CD-ROM 108 to HDD 105, and copied to RAM 104 and read by CPU 101 at the start-up of computer unit 100.

Figure 5:
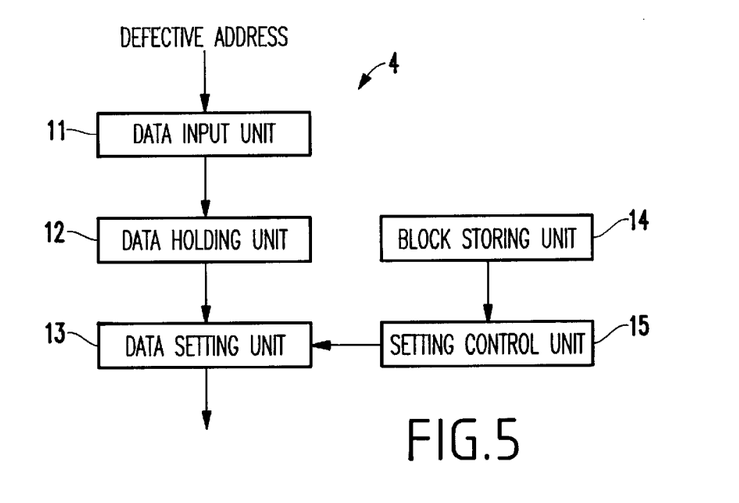
FIG. 5 is a block diagram showing a logical structure of the computer unit.

In this manner, CPU 101 reads proper programs to execute various processing operations, thereby logically implementing data input unit 11, data holding unit 12, data setting unit 13, block storing unit 14 and setting control unit 15 in data setting apparatus 4 as shown in FIG. 5.

Data input unit 11 receives a data file including word addresses of regular word lines 1002 to be replaced in DRAM 2000. CPU 101 for executing predetermined processing operations corresponding to the control programs held in RAM 104 controls input data to communication interface 113, thereby achieving the functions of data input unit 11.

Data holding unit 12 temporarily holds the data file such as word addresses inputted to data input unit 11. CPU 101 which operates corresponding to the control programs in RAM 104 causes the input data to communication interface 113 to be temporarily held in a work area of RAM 104 or the like, thereby achieving the functions of data holding unit 12.

Data setting unit 13 sets the word address supplied to data input unit 11 in fuse ROM 2002 in DRAM 2000. CPU 101 which operates corresponding to the control programs in RAM 104 controls the operations of address setting unit 200 through communication interface 113, thereby achieving the functions of data setting unit 13.

Block storing unit 14 previously stores, as block data, combinations of operation blocks such as ("a" and "c"), ("b" and "d"), . . . which are simultaneously activated in DRAM 2000. Block storing unit 14 corresponds to a predetermined database which is constituted in HDD 105 or the like and recognized by CPU 101 which operates corresponding to the control programs in RAM 104.

Setting control unit 15 refers to the stored data in block storing unit 14, and controls the operation of data setting unit 13 such that regular word line 1002 to be replaced and replacing spare word line 1003 are located in the same operation block or not located each in combined operation blocks which are activated simultaneously. The functions of setting control unit 15 are achieved by CPU 101 which performs predetermined processing operations corresponding to the control programs stored in RAM 104.

For example, in combinations ("a" and "c"), ("b" and "d"), . . . of operation blocks activated simultaneously in DRAM 2000 as mentioned above, if regular word line 1002 to be replaced is located in operation block "a", the same operation block is "a", and an operation block in a combination which is not activated simultaneously is "b" or "d".

Data input unit 11, data holding unit 12, data setting unit 13, block storing unit 14 and setting control unit 15 may be realized by utilizing only inherent hardware such as communication interface 13 as required. However, in the example herein described, they are realized by the operations of CPU 101, which is hardware of computer unit 100, corresponding to the software stored in an information storage medium such as RAM 104. Additionally, to realize the respective functions of data input unit 11, data holding unit 12, data setting unit 13, block storing unit 14 and setting control unit 15 in data setting apparatus 4, some of them may be comprised of hardware and the remaining portions may be comprised of software.

The control programs as described above are stored in an information storage medium such as RAM 104 as programs for causing CPU 101 to execute processing operations, for example, receiving the input of a data file including word addresses of regular word lines 1002 to be replaced in DRAM 2000, temporarily holding the inputted data file in RAM 104 or the like, setting the inputted word addresses of regular word lines 1002 in fuse ROM 2002 in DRAM 2000 with operation control of address setting unit 200, previously storing combinations of operation blocks which are simultaneously activated in DRAM 2000 in RAM 104 or the like, and referring to the stored data and controlling the data setting such that regular word line 1002 to be replaced and replacing spare word line 1003 are located in the same operation block or not located each in combined operation blocks which are activated simultaneously.

In memory fabricating system 1 of the present embodiment, memory manufacturing apparatus 2 manufactures semiconductor memory device 2000 which is inspected by memory test apparatus 3. Next, the operation of memory test apparatus 3 is described with reference to FIG. 6.

Figure 6:
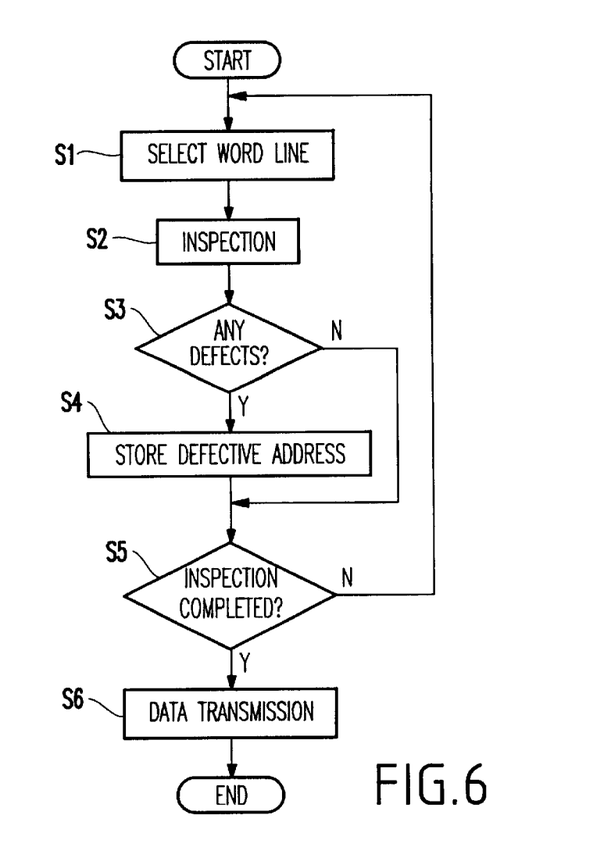
FIG. 6 is a flow chart showing processing with a memory test apparatus.

Memory test apparatus 3 selects one of regular word lines 1002 in semiconductor memory device 2000 at step S1, and inspects the selected regular word line at step S2. At step S3, memory test apparatus 3 determines whether the word line is defective as a result of the inspection, and if defective, stores its word address as identification data at step S4. At step S5, then memory test apparatus 3 determines whether the inspections of all regular word lines 1002 in semiconductor memory device 2000 are completed or not. If not, the processing returns to step S1 to select a next word line. If the inspections of all the regular word lines are completed, stored defective word addresses are combined with identification data of semiconductor memory device 2000 or the like to create a data file which is transferred to data setting apparatus 4 at step S6.

Memory test apparatus 3 performs various tests other than the aforementioned inspection of regular word line 1002 in actual memory manufacturing system 1.

Figure 3:
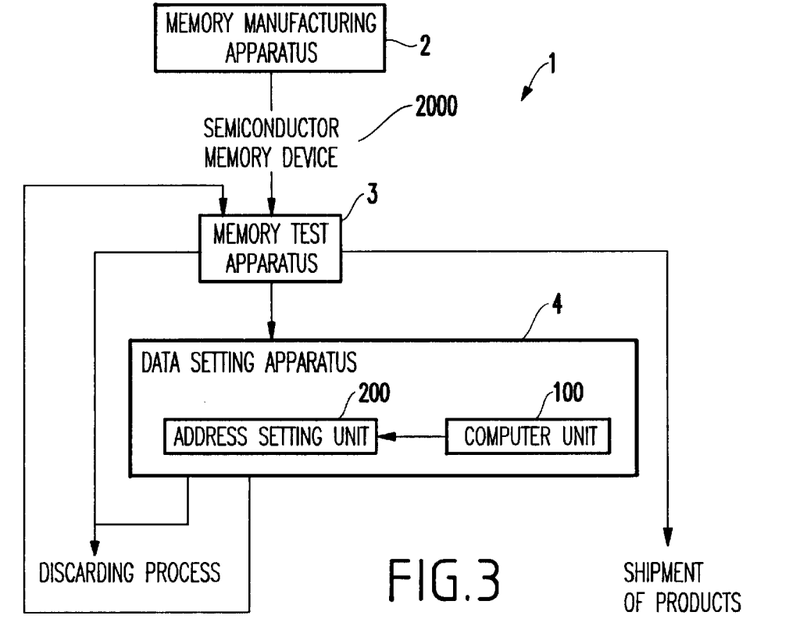
FIG. 3 is a diagram schematically showing an entire structure of a memory fabricating system.

In this memory fabricating system, as shown in FIG. 3, semiconductor memory device 2000 having no defect found by memory test apparatus 3 is shipped as a product without being carried to data setting apparatus 4. Semiconductor memory device 2000 having defects exceeding a predetermined acceptable range in number found by memory test apparatus 3 is discarded without being carried to data setting apparatus 4. Semiconductor memory device 2000 having defects found but within an acceptable range in number is carried to data setting apparatus 4.

Figure 7:
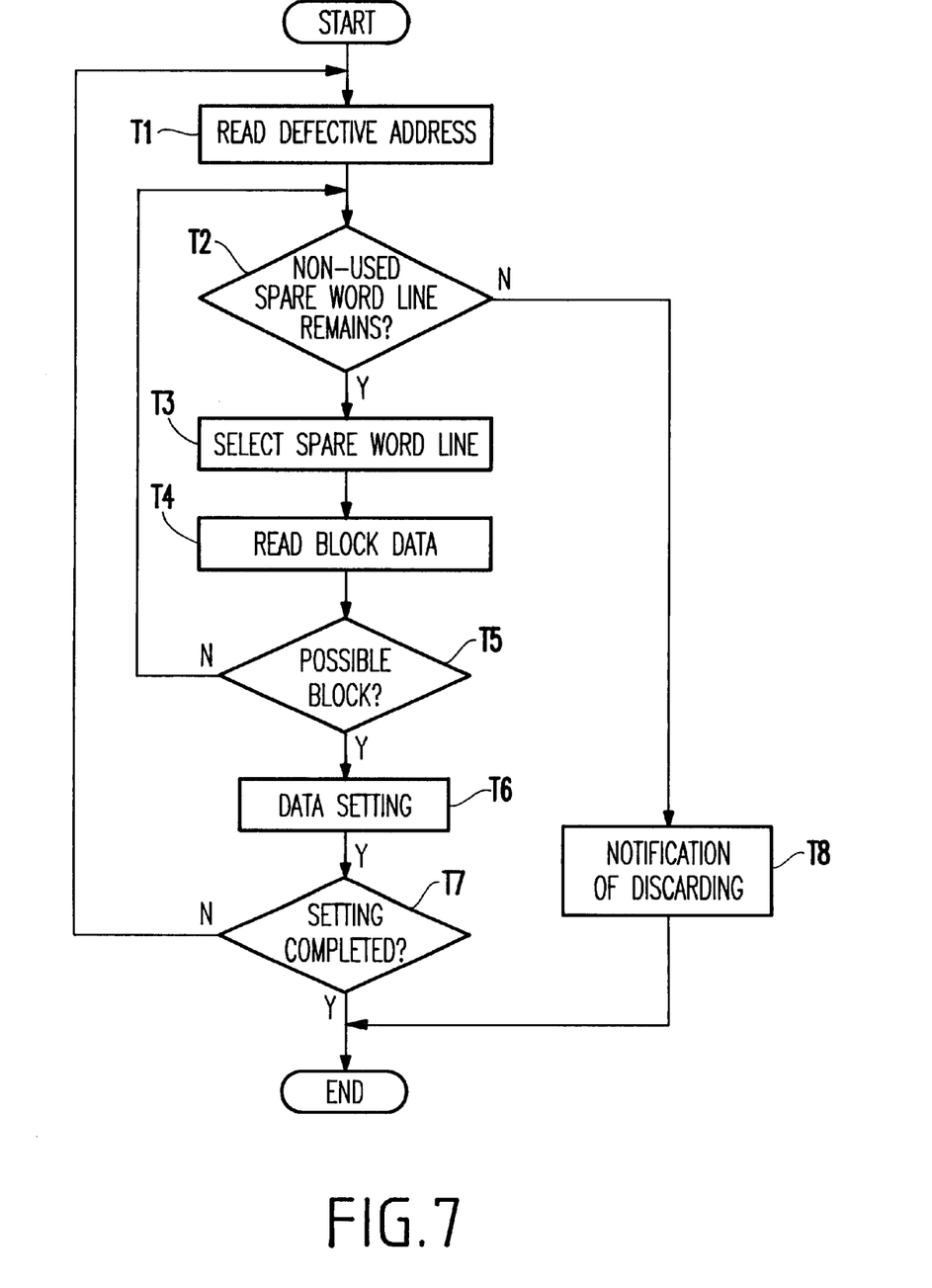
FIG. 7 is a flow chart showing a data setting method using the computer unit of the data setting apparatus.

Data setting apparatus 4 is supplied with semiconductor memory device 2000 for which the inspection is completed from memory test apparatus 3 together with a corresponding data file. Data setting apparatus 4 analyzes the data file with computer unit 100 and sets the word addresses of defective regular word lines 1002 in fuse ROM 2002 in semiconductor memory device 2000 with address setting unit 200. More specifically, computer unit 100 of data setting apparatus 4 receives the data file of the inspection result of the semiconductor memory device through communication interface 113 and temporarily stores it in RAM 104. Computer unit 100 then sequentially reads the word addresses of defective regular word lines 1002 from the data file of the inspection result with CPU 101 at step T1 as shown in FIG. 7. Next, at step T2, computer unit 100 checks whether there is spare word line 1003 remaining which has been not subjected to replacement processing. At step T3, one of the spare word lines without replacement processing is selected.

Next, at step T4, computer unit 100 reads from HDD 105 the block data of the operation block in which the selected spare word line 1003 is located. At step T5, computer unit 100 checks, with the block data, whether regular word line 1002 to be replaced and replacing spare word line 1003 are located in the same operation block or not located each in combined operation blocks which are activated simultaneously. For example, in combinations ("a" and "c"), ("b" and "d"), . . . of operation blocks which are simultaneously activated in DRAM 2000 as described above, if regular word line 1002 to be replaced is located in operation block "a", replacing spare word line 1003 may be located in an operation block other than operation block "c", i.e. operation block "a", "b", or "d".

As described above, when it is determined that the operation block of spare word line 1003 is proper at step T5, computer unit 100 of data setting apparatus 4 controls address setting unit 200 to set the word address of regular word line 1002 to be replaced in fuse ROM 2002 of DRAM 2000 at step T6 such that that spare word line 1003 serves as a replacement. On the other hand, step T5 does not determine that the operation block of the spare word lines is not proper, the processing returns to step T2 to perform the aforementioned processing for another spare word line.

After the execution of step T6, a check is made to determine whether all the defective addresses has been processed, i.e. whether the setting is completed, at step T7. If the setting is completed, the processing at data setting apparatus 4 is finished, or the processing returns to step T1 if not.

When data setting apparatus 4 detects the shortage of spare word line 1003 serving as a replacement, the processing moves to step T8 to present to a user a predetermined message on display 112 indicating that DRAM 2000 can not be set for replacement, and DRAM 2000 is discarded.

When all of the word addresses of defective regular word lines 1002 in DRAM 2000 are set in fuse ROM 2002 as described above, DRAM 2000 is again carried to memory test apparatus 3 for a second inspection.

DRAM 2000 for which the replacement setting is completed in data setting apparatus 4 in this manner generates a plurality of word addresses from a single cell address similarly to a conventional DRAM and activates one regular word line 1002 for each word address. At this time, when regular word line 1002 to be activated is defective and its word address is set in fuse ROM 2002, that defective regular word line 1002 is replaced with. predetermined spare word line 1003 under the control of word control circuit 2001. However, since spare word line 1003 need not be located in the same operation block as regular word line 1002 in DRAM 2000, the replacement setting of spare word line 1003 has a high degree of flexibility and defective regular word lines 1002 can be handled by a minimum number of spare word lines 1003. Additionally, regular word line 1002 to be replaced and replacing spare word line 1003 are, when not located in the same operation block, located respectively in operation blocks which are not activated simultaneously. As a result, since spare word line 1003 and regular word line 1002 in one operation block are not activated simultaneously, DRAM 2000 generates no malfunction.

For example, when operation blocks "a" and "c" are simultaneously activated in DRAM 2000, spare word line 1003 which replaces defective regular word line 1002 in operation block "a" is not located in operation block "c" but located in one of operation blocks "a", "b" and "d". When defective regular word line 1002 in operation block "a" is replaced with spare word line 1003 in the same operation block "a", spare word line 1003 in operation block "a" and regular word line 1002 in operation block "c" are simultaneously activated in DRAM 2000, thereby generating no malfunction. When defective regular word line 1002 in operation block "a" is replaced with spare word line 1003 in operation block "b", spare word line 1003 in operation block "b" and regular word line 1002 in operation block "c" are simultaneously activated in DRAM 2000, thereby generating no malfunction.

According to data setting apparatus 4, since word addresses of regular word lines 1002 to be replaced can be set in fuse ROM 2002 so as to generate no malfunction in DRAM 2000 as described above, memory fabricating system 1 can provide DRAM 2000 with favorable yields. Specifically, according to data setting apparatus 4, even when DRAM 2000 has an existing structure which imposes no limitation in terms of hardware upon combinations of operation blocks of regular word line 1002 to be replaced and replacing spare word line 1003, regular word line 1002 and replacing spare word line 1003 can be located in the same operation block or not located each in combined operation blocks which are activated simultaneously. In other words, the structure of DRAM 2000 before it is supplied to data setting apparatus 4 may be the same as the prior art, so that memory fabricating apparatus 2 and memory test apparatus 3 identical to those in the prior art may be used. Therefore, according to memory manufacturing system 1, it is possible to manufacture DRAM 2000 with malfunctions being reliably prevented using simple equipment and with satisfactory productivity.

The present invention is not limited to the aforementioned embodiment, and allows various modifications without departing the appended claims.

Figure 8:
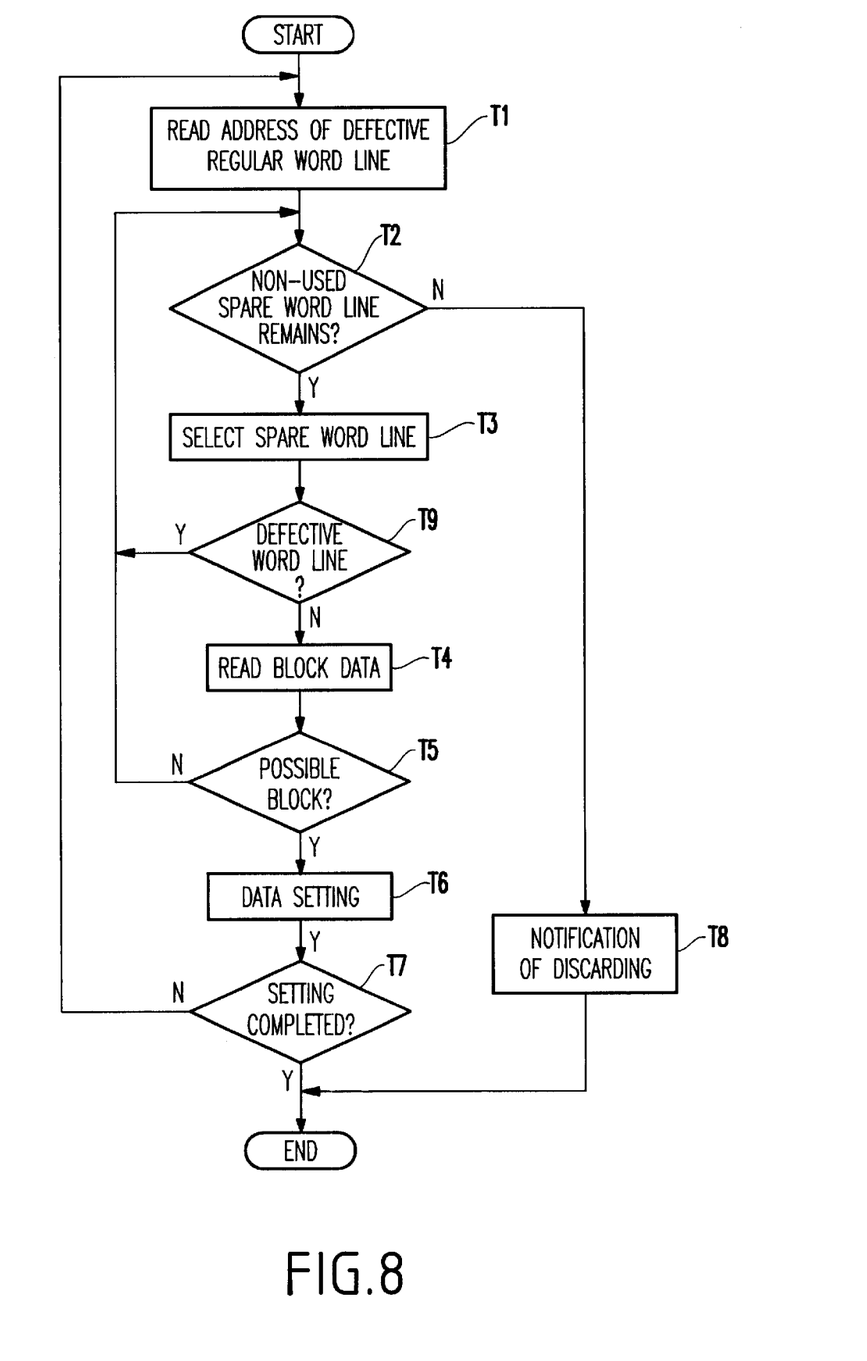
FIG. 8 is a flow chart showing another example of the data setting method.

For example, in the aforementioned embodiment, memory test apparatus 3 inspects only operations for regular word line 1002, DRAM 2000 for which replacement setting has been performed by data setting apparatus 4 is again carried to memory test apparatus 3, and only DRAMs 2000 whose normal operations have been ensured by memory test apparatus 3 are shipped as products. In this case, defective spare word line 1003 set as a replacement in DRAM 2000 is, if any, found in the inspection by memory test apparatus 3 and again replaced with another spare word line 1003 with data setting apparatus 4, thereby making it possible to ship as products only DRAMs 2000 of reliably normal operations. However, it is possible to simultaneously test both regular word line 1002 and spare word line 1003 in DRAM 2000 by memory test apparatus 3. FIG. 8 is a flow chart showing processing in this case. The processing shown in FIG. 8 has step T9, for determining whether or not a spare word line selected at step T3 is defective, added between step T3 and step T4 in the processing shown in FIG. 7. If the spare word line is determined as defective at step T9, the processing returns to step T2 for continuing the processing with a next spare word line. In this manner, defective spare word line 1003 can be removed from subjects of replacement in data setting apparatus 4. In this case, since defective regular word line 1002 is not replaced with defective spare word line 1003 even when the inspection processing of memory test apparatus 3 and the replacement setting of data setting apparatus 4 are respectively performed once, the productivity of DRAM 2000 can be improved.

Figure 9:
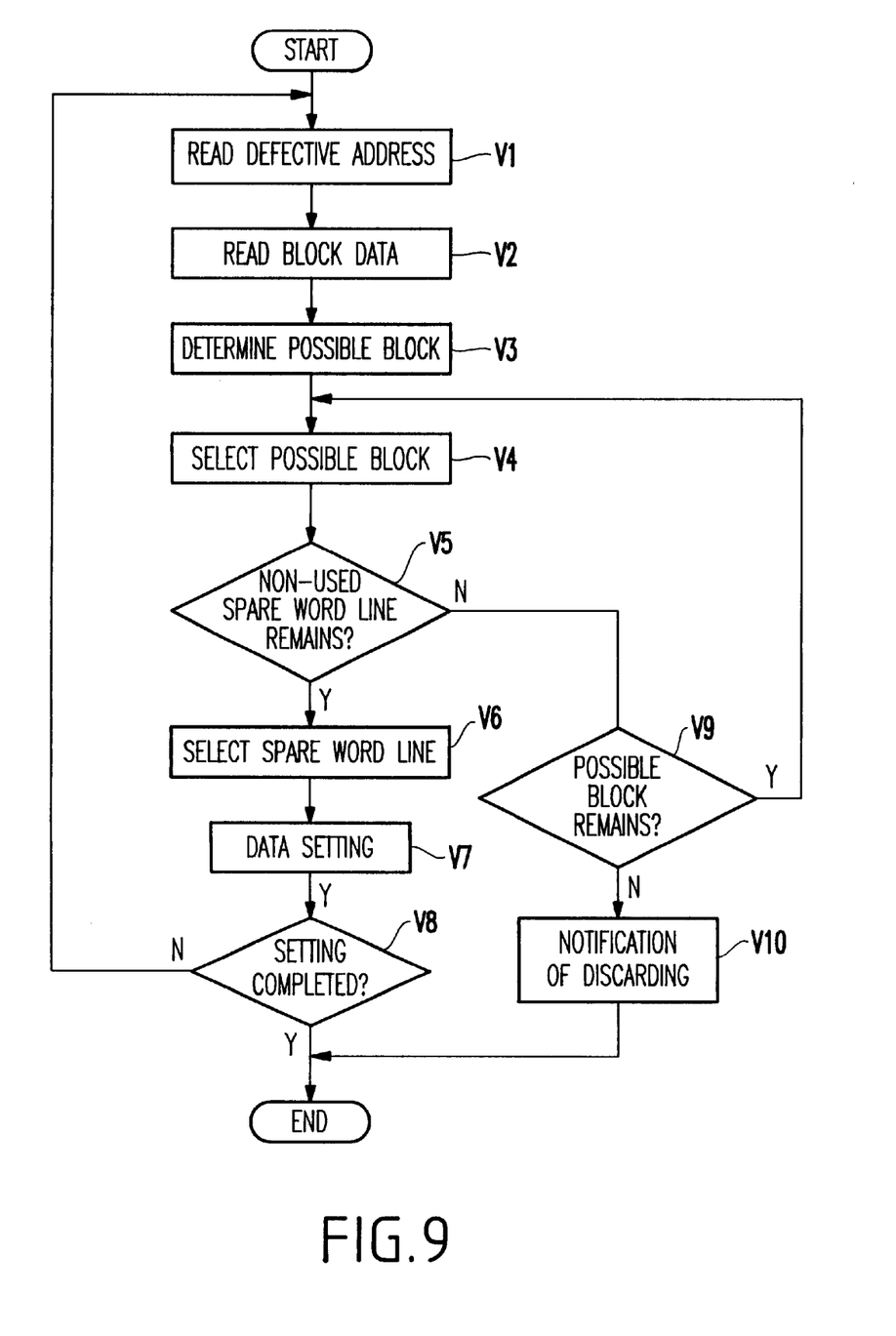
FIG. 9 is a flow chart showing a yet further example of the data setting method.

Additionally, the aforementioned embodiment illustrates that, when data setting apparatus 4 determines replacing spare word line 1003 for regular word line 1002 to be replaced, data setting apparatus 4 conveniently selects spare word line 1003 and then checks whether it is proper or not with the block data. However, it is possible to first determine an operation block which can replace regular word line 1002 to be replaced with the block data and then to select spare word line 1003 located in the operation block. FIG. 9 is a flow chart for explaining processing in this case.

First, at step V1, one of word addresses of defective regular word lines is read, and the block data is read at step V2. Next, at step V3, a check is made to determine which operation blocks can replace the defective regular word line to be replaced. At step V4, an operation block is selected from the operation blocks usable for replacement, and at step V5, a check is made to determine whether there is a spare word line remaining which has been not subjected to replacement processing in the selected operation block. If spare word lines with no replacement processing remain, one of them is selected at step V6. Data setting is performed at step V7 and whether the setting is completed is determined at step V8. If the setting is completed, the processing in the data setting apparatus is finished, or if not completed, the processing returns to step V1 for processing of a next defective regular word line.

If no spare word line remains at step V5, a check is made to determine whether any operation block usable for replacement remains at step V9. If any operation block remains, the processing returns to step V4, or if not, the processing is finished after a notification of discarding to a user at step V10.

Additionally, the aforementioned embodiment assumes that the software installed previously from CD-ROM 108 or the like to HDD 105 is copied to RAM 104 at the start-up of computer unit 100, and the software thus stored in RAM 104 is read by CPU 101. However, such software may be utilized by CPU 101 in a state where the software is stored in HDD 105 or may be fixedly stored in ROM 103 previously. While software may be stored in FD 106 or CD-ROM 108 which is an information storage medium treatable as a standalone product, and may be installed from FD 106 or the like to HDD 105 or RAM 104, the software may be directly read by CPU 101 from FD 106 or the like without performing such installation for executing processing operations.

In other words, when various functions of computer unit 100 are realized by software, the software may be any which is read by CPU 101 for performing corresponding operations. The control programs for realizing the aforementioned various means may be formed with a combination of a plurality of software. In this case, only minimum software required for realizing computer unit 100 may be stored in an information storage medium which is a standalone product. For example, when computer unit 100 having an existing operating system implemented thereon is provided with application software by means of an information storage medium such as CD-ROM 108, the software for realizing various means of computer unit 100 is realized by a combination of the application software and the operating system. This enables the elimination of some of the software dependent on the operating system from the application software of the information storage medium.

The approach of supplying CPU 101 with the software described in the information storage medium in this manner is not limited to the direct mounting of the information storage medium into computer unit 100. For example, it is possible that software as mentioned above is stored in an information storage medium of a host computer which is connected to a terminal computer through a communication network such that the software is provided from the host computer to the terminal computer through data communication. In this case, while the terminal computer may perform standalone processing operations in a state where the software is downloaded into its own information storage medium, the terminal computer may perform processing operations with real time data communication to and from the host computer without downloading the software. In this case, the entire system which connects the host computer and the terminal computer through the communication network corresponds to computer unit 100 of data setting apparatus 4.

While preferred embodiments of the present invention have been described using specific terms, such description is for illustrative purposes only, and it is to be understood that changes and variations may be made without departing from the spirit or scope of the following claims.

What is claimed is:

1. A data setting apparatus for setting word addresses in a semiconductor memory device which comprises a plurality of memory cells arranged two-dimensionally in a row direction and in a column direction and divided into a plurality of operation blocks, a plurality of regular word lines provided for each of said plurality of operation blocks, each of said regular word lines connected to a plurality of memory cells belonging to the same row, a spare word line provided for each of said plurality of operation blocks and connected to a plurality of memory cells belonging to the same row, and address storing means for storing a combination of a word address of a regular word line to be replaced and a word address of a replacing spare word line, said data setting apparatus comprising:
block data storing means for previously storing combinations of said operation blocks which are simultaneously activated in said semiconductor memory device;
word line inspection means for inspecting said semiconductor memory device to find a defective regular word line;
data setting means for setting a word address of said found regular word line in said address storing means; and
setting control means for referring to stored data in said block data storing means and controlling the data setting operations of said data setting means such that said regular word line to be replaced and said replacing spare word line are located in the same operation block, or not located each in combined operation blocks which are activated simultaneously.

2. The data setting apparatus according to claim 1, wherein
each of said memory cells having a unique cell address set therefor, and
said semiconductor memory device further comprises a plurality of bit lines provided for each of said plurality of operation blocks, each of said bit lines connected to a plurality of memory cells belonging to the same column; an address decoder for generating a bit address and a plurality of word addresses in accordance with a cell address provided from outside; a word driver for activating one of said word lines simultaneously in each of said plurality of operation blocks of a predetermined combination in accordance with said plurality of word addresses; and replacement control means for, when a word address generated by said address decoder matches a word address of said regular word line to be replaced set in said address storing means, causing said word driver to activate said spare word line at a corresponding replacing word address as an alternative to said regular word line to be replaced.

3. The data setting apparatus according to claim 1, wherein
said word line inspection means also inspects spare word lines of said semiconductor memory device to find a defect, and
said setting control means controls the data setting operations of said data setting means such that a spare word line having the defect found by said word line inspection means is not a replacement.

4. A data setting apparatus for setting word addresses in a semiconductor memory device which comprises a plurality of memory cells arranged two-dimensionally in a row direction and in a column direction and divided into a plurality of operation blocks, a plurality of regular word lines provided for each of said plurality of operation blocks, each of said regular word lines connected to a plurality of memory cells belonging to the same row, a spare word line provided for each of said plurality of operation blocks and connected to a plurality of memory cells belonging to the same row, and address storing means for storing a combination of a word address of a regular word line to be replaced and a word address of a replacing spare word line, said data setting apparatus comprising:
block data storing means for previously storing combinations of said operation blocks which are simultaneously activated in said semiconductor memory device;
data input means for receiving identification data of said regular word line to be replaced in said semiconductor memory device;
data setting means for setting a word address of the regular word line whose identification data has been inputted to said data input means in said address storing means; and
setting control means for referring to stored data in said block data storing means and controlling the data setting operations of said data setting means such that said regular word line to be replaced and said replacing spare word line are located in the same operation block, or not located each in combined operation blocks which are activated simultaneously.

5. The data setting apparatus according to claim 4, wherein
each of said memory cells having a unique cell address set therefor, and
said semiconductor memory device further comprises a plurality of bit lines provided for each of said plurality of operation blocks, each of said bit lines connected to a plurality of memory cells belonging to the same column; an address decoder for generating a bit address and a plurality of word addresses in accordance with a cell address provided from outside; a word driver for activating one of said word lines simultaneously in each of said plurality of operation blocks of a predetermined combination in accordance with said plurality of word addresses; and replacement control means for, when a word address generated by said address decoder matches a word address of said regular word line to be replaced set in said address storing means, causing said word driver to activate said spare word line at a corresponding replacing word address as an alternative to said regular word line to be replaced.

6. The data setting apparatus according to claim 4, wherein
said data input means also receives identification data of a defective spare word line of said semiconductor memory device,
said block data storing means also stores the identification data of the defective spare word line inputted to said data input means, and
said setting control means controls the data setting operations of said data setting means such that the defective spare word line whose identification data has been stored in said block data storing means is not a replacement.

7. A semiconductor memory device comprising:
a plurality of memory cells arranged two-dimensionally in a row direction and in a column direction and divided into a plurality of operation blocks, each of said memory cells having a unique cell address set therefor;
a plurality of regular word lines provided for each of said plurality of operation blocks, each of said regular word lines connected to a plurality of memory cells belonging to the same row;
a spare word line provided for each of said plurality of operation blocks and connected to a plurality of memory cells belonging to the same row; and address storing means for setting word address such that a regular word line to be replaced and a replacing spare word line are located in the same operation block, or not located each in combined operation blocks which are activated simultaneously.

8. The semiconductor memory device according to claim 7, further comprising:

a plurality of bit lines provided for each of said plurality of operation blocks, each of said bit lines connected to a plurality of memory cells belonging to the same column;

an address decoder for generating a bit address and a plurality of word addresses in accordance with a cell address provided from the outside;

a word driver for activating one of said word lines simultaneously in each of said plurality of operation blocks of a predetermined combination in accordance with said plurality of word addresses;

replacement control means for, when a word address generated by said address decoder matches a word address of said regular word line to be replaced set in said address storing means, causing said word driver to activate said spare word line at a corresponding replacing word address as an alternative to said regular word line to be replaced.

* * * * *